United States Patent
Hand et al.

(10) Patent No.: US 7,173,950 B2
(45) Date of Patent: Feb. 6, 2007

(54) LOW-NOISE HIGH-POWER SHG LASER SYSTEM

(75) Inventors: Carter F. Hand, Los Altos, CA (US); Weizhi Wang, San Jose, CA (US)

(73) Assignee: Bookham Technology PLC, Northamptonshire (GB)

( * ) Notice: Subject to any disclaimer, the term of this patent is extended or adjusted under 35 U.S.C. 154(b) by 178 days.

(21) Appl. No.: 10/877,572

(22) Filed: Jun. 25, 2004

(65) Prior Publication Data

US 2005/0286573 A1  Dec. 29, 2005

(51) Int. Cl.
  H01S 3/10  (2006.01)
  H01S 3/091 (2006.01)
  H01S 3/092 (2006.01)
  H01S 3/093 (2006.01)
  H01S 3/08  (2006.01)

(52) U.S. Cl. .............. 372/22; 372/70; 372/72; 372/92

(58) Field of Classification Search .......... 372/70, 372/92
See application file for complete search history.

(56) References Cited

U.S. PATENT DOCUMENTS

| | | | |
|---|---|---|---|
| 5,027,361 A | 6/1991 | Kozlovsky et al. | |
| 5,036,220 A | 7/1991 | Byer et al. | |
| 5,355,247 A | 10/1994 | Byer et al. | |
| 5,448,398 A * | 9/1995 | Asakura et al. | 359/328 |
| 5,475,526 A | 12/1995 | Byer et al. | |
| 5,559,824 A * | 9/1996 | Baird et al. | 372/95 |
| 5,644,422 A | 7/1997 | Bortz et al. | |
| 5,644,584 A * | 7/1997 | Nam et al. | 372/20 |
| 5,714,198 A | 2/1998 | Byer et al. | |
| 5,838,702 A | 11/1998 | Byer et al. | |
| 6,480,325 B1 | 11/2002 | Batchko et al. | |
| 6,903,341 B2 * | 6/2005 | Imai et al. | 250/340 |
| 2003/0007535 A1* | 1/2003 | Haase et al. | 372/50 |
| 2003/0235228 A1* | 12/2003 | Bacher et al. | 372/70 |
| 2004/0165639 A1* | 8/2004 | Lang et al. | 372/92 |

OTHER PUBLICATIONS

"FAQs—Benchtop Tunable Lasers," located at <http://www.newfocus.com/support/faqs/benchtop_tunables_faqs.cfm> visited on Nov. 20, 2003; 7 pgs.
"User's Guide 6000 Vortex Series Tunable Diode Laser," (2002), New Focus, San Jose, CA, 64 pgs.

* cited by examiner

Primary Examiner—Minsun Harvey
Assistant Examiner—Kelly Rogers
(74) Attorney, Agent, or Firm—Morrison & Foerster LLP

(57) ABSTRACT

A second harmonic generation laser system comprising: a non-linear frequency converting medium; and an external cavity pump laser that produces optical energy at a single mode and at a single frequency and that is disposed to provide the optical energy to the non-linear frequency converting medium.

14 Claims, 3 Drawing Sheets

LOW-NOISE HIGH-POWER SHG LASER SYSTEM

BACKGROUND OF THE INVENTION

1. Field of the Invention

The present invention relates in general to generation of second-harmonic laser light and, more particularly, to generation of both fixed-frequency and tunable second harmonic laser light with reduced intensity noise.

2. Description of the Related Art

A second harmonic generation laser typically includes a pump laser and a non-linear material, which converts optical energy emanating from the pump laser to optical energy of a desired frequency. Laser harmonic regeneration is well known and is described, for example, in U.S. Pat. No. 5,027,361, entitled Efficient Laser Harmonic Generation Employing A Low-Loss External Optical Resonator, invented by Kozlovsky, et al; U.S. Pat. No. 5,036,220, entitled Non-Linear Optical Radiation Generator and Method of Controlling Regions of Ferroelectric Polarization Domains in Solid State Bodies, invented by Byer, et al; U.S. Pat. No. 5,355,247, entitled Method Using a Monolithic Crystalline Material for Producing Radiation by Quasi-Phase-Matching, Diffusion Bonded Monolithic Crystalline Material for Quasi-Phase-Matching, and Method for Fabricating Same, invented by Byer, et al; U.S. Pat. No. 5,644,422, entitled Techniques of Radiation Phase Matching Within Optical Crystals, invented by Bortz, et al, each of which is expressly incorporated herein by this reference.

Non-linear optical crystals have been used to double the frequency of an incident laser beam through generation of a second harmonic within the crystal. Non-linear optical crystals also have been used to generate laser radiation that has a frequency equal to the sum or difference of the frequencies of two incident radiation beams. There are many materials, referred to herein as non-linear frequency converting media, that have been used or suggested over the years for use as a mixing crystal, such as KTP ($KTiOPO_4$), lithium tantalate ($LiTaO_3$), and lithium niobate ($LiNbO_3$). It is common to use such crystals as a second harmonic generator that doubles the frequency output of a pump laser source. This allows the use of long wavelength lasers, such as those in the infrared region of the spectrum, in a system that generates shorter wavelength light in the green or blue portion of the spectrum.

Intensity noise can arise in SHG laser systems primarily from the pump laser source. Traditional pump laser sources have been noisy due to modal instability, wavelength instability and broad output spectra, for example. Resulting fluctuations in pump laser output can be amplified in the non-linear optic material, resulting in SHG output intensity fluctuations that typically can vary from 1–5%.

For instance, a typical Fiber Bragg Grating stabilized laser ordinarily operates with multiple modes. As used herein, a mode designates the number of half-wavelengths within a laser cavity. Optical energy may shift between modes. In other words, the proportion of the total optical energy produced by a pump laser that is within any given mode may change as the energy shifts among the multiple modes.

Unfortunately, mode changes of the fundamental frequency produced by a laser pump source can result in a noise spike in the harmonic wavelength produced by the non-linear optical medium. In the past, Fiber Bragg Gratings (FBGs) have been used to stabilize pump lasers. However, this approach can be inefficient because the pump laser emission wavelength should match the acceptance frequency range of the non-linear optics. As a result, for example, it may be necessary to temperature-tune the non-linear optical medium to match the wavelength of the pump laser. Also, due to the relatively long cavity length in an FBG stabilized pump laser, several optical modes may coexist within the cavity, thereby increasing the intensity noise of the laser.

Thus, there has been a need for an improved system for laser harmonic generation with reduced intensity noise. The present invention meets this need.

SUMMARY OF THE INVENTION

A second harmonic generation laser system is provided. A non-linear frequency converting medium and a fixed-frequency or tunable external cavity pump laser produce optical energy at a single constant mode or a single tunable mode and at a single constant frequency or at a single tunable frequency. The external cavity pump laser is disposed to provide the optical energy to the non-linear frequency converting medium. Intensity noise is reduced since the laser mode is maintained constant. The non-linear frequency converting medium may be disposed outside (extracavity) the laser cavity or inside the laser cavity (intracavity).

In an intracavity embodiment, since conversion efficiency of the non-linear frequency converting medium is proportional to the power intensity of light within the medium's acceptance band, the non-linear frequency converting medium can produce higher power frequency-double light, despite pump depletion losses.

These and other features and advantages of the invention will be apparent from the following detailed description in conjunction with the appended drawings.

DETAILED DESCRIPTION OF THE PREFERRED EMBODIMENTS

The present invention provides a novel low noise, high power second harmonic generation (SHG) laser system and associated method. The following description is presented to enable any person skilled in the art to make and use the invention. The embodiments of the invention are described in the context of particular applications and their requirements. These descriptions of specific applications are provided only as examples. Various modifications to the preferred embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
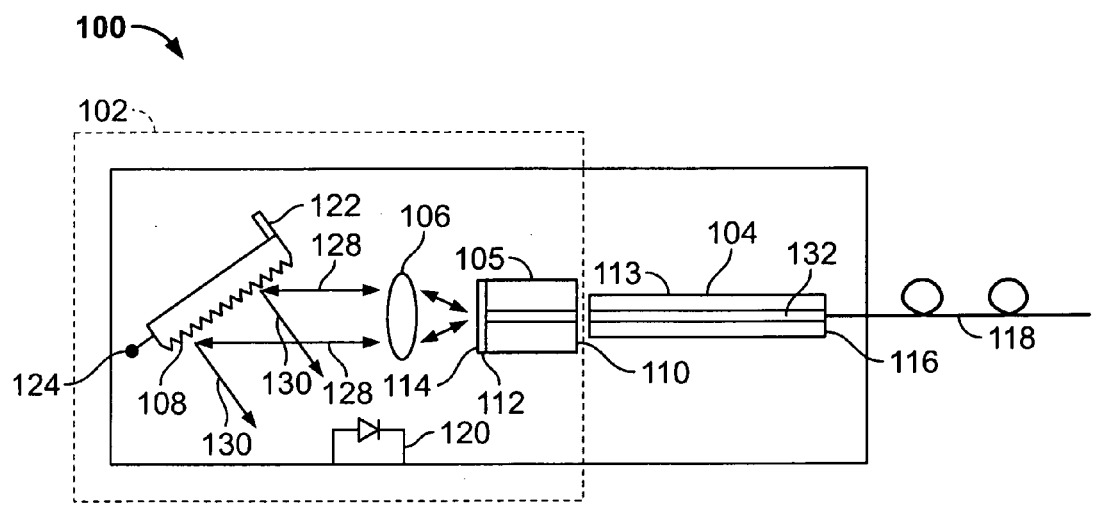
FIG. 1 is an illustrative drawing of an extracavity SHG laser system in accordance with an embodiment of the invention.

FIG. 1 is an illustrative diagram of an extracavity SHG laser system 100 in accordance with an embodiment of the invention. The extracavity SHG laser system 100 includes a laser pump source 102, shown within dashed lines, and non-linear frequency converting medium 104, referred to herein as a non-linear optic (NLO). This embodiment is referred to as "extracavity" because the NLO is disposed outside the pump source resonant cavity.

The laser pump source 102 includes laser diode 105, a collimating lens 106 and a diffraction grating 108, which serves as a wavelength selective mirror. The laser diode 105 includes a first front facet 110 disposed to face a first end 113 of the NLO 104 and includes a second front facet 112 disposed to face the collimating lens 106. An anti-reflective (AR) coating 114 is disposed on the second front facet 112. A second end 116 of the NLO 104 is disposed adjacent a fiber output 118. A power monitor 120 is provided to monitor the intensity of laser operation. A piezo-actuator 122 is provided to effect selective rotation of the mirror 108 about a pivot point 124.

The laser pump source 102 is configured to operate as an external cavity laser diode in a Littrow configuration. The pump laser source resonant cavity, which also is referred to herein as a resonant cavity, extends from the laser diode first front facet 110, which serves as one reflective surface, to the diffraction grating 108, which serves as another reflective surface. Light emitted by the laser diode 105 passes through the second front facet 112 and the AR coating 114. The collimating lens 106 collimates the light. The collimated light passes to the diffraction grating 108. First-order diffraction from the grating 108 is diffracted back on itself as indicated by arrows 128. The diffracted first-order light passes back through lens 106 to laser diode 105. Zero-order diffraction indicated by arrows 130 is diffracted in a different direction.

In a Littrow configuration, the pump laser 102 operates in a single longitudinal mode by creating a wavelength-dependent loss within the laser cavity. Basically, the diffraction grating 108 that serves as the wavelength selective mirror is used to selectively feed back a desired wavelength into the laser diode 105. Thus, the gain at the desired wavelength is increased, and a corresponding mode is preferred. Selecting a desired wavelength also sets a corresponding resonant frequency within the resonant cavity of the pump source 102. The retro-reflection of first-order light occurs when, $$m\lambda = 2d \sin \alpha \quad (1)$$

where m is the order of diffraction (after feedback, m=1), d is the grating constant, $\alpha$ is the angle of incidence and $\lambda$ is wavelength.

The single mode, tunable or fixed frequency light produced by the pump laser source 102 should have a frequency that is within the acceptance band of the NLO 204. An NLO acceptance band is defined such that at the edge of such band the frequency doubling efficiency drops from the peak value to its half. It is possible to tune the desired wavelength $\lambda$ by using the piezo actuator 122 to rotate the grating 108 relative to pivot point 124. Such rotation changes the angle of incidence $\alpha$, called the Littrow angle (i.e., the grating angle relative to the laser axis) and thereby changes the value of $\lambda$ to ensure that it is within the acceptance band. Note that this can be done while the laser is in operation in order to produce a tunable pump laser, and thus a tunable frequency doubled laser.

Intensity noise is reduced in the laser pump source 105, since mode hopping is avoided through strong feedback via the external-cavity. In one embodiment, NLO 104 comprises magnesium doped periodically polled lithium niobate with a quasi-phase matched (QPM) grating, although different non-linear materials can be employed. A waveguide 132 is defined within or formed upon the NLO 104 for confining optical energy (laser light) produced by the pump source 102. The NLO 104 receives single-mode light, which emanates from the first front facet 110 at the resonant frequency. The NLO 104 doubles the frequency (and halves the wavelength) of the received light and emits light at the doubled frequency at its second end 116. The frequency-doubled light is input to a fiber output 118.

Provided the NLO acceptance band is wide enough, the piezo-actuator 122 can be used to selectively vary the resonant frequency of the pump laser 102 that is coupled into the NLO 104. The resultant SHG frequency produced by the NLO 104 changes accordingly. Thus, the extracavity SHG laser system 100 can be used as a tunable SHG laser device by rotation of the diffraction grating 108.

Figure 2:
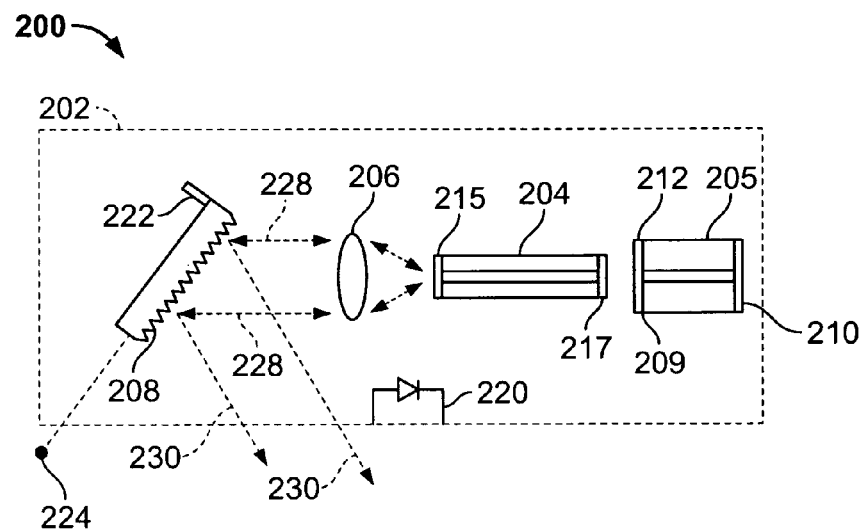
FIG. 2 is an illustrative drawing of a first intracavity SHG laser system in accordance with a first intracavity laser system embodiment of the invention.

FIG. 2 is an illustrative diagram of a first intracavity SHG laser system 200 in accordance with a first intracavity laser system embodiment of the invention. The first intracavity SHG laser system 200 includes a laser pump source 202, shown within dashed lines, and an NLO 204, which is disposed within a resonant cavity of the pump source 102. The disposition of the NLO 204 within the resonant cavity is believed to result in increased overall output power of the frequency-doubled optical energy, since the NLO 204 receives as input fundamental frequency optical energy that is circulating within the cavity.

In essence, the intracavity SHG laser system 200 of FIG. 2 will operate similar to the extracavity SHG laser system 100 of FIG. 1, although the NLO 204 is disposed inside the laser cavity. The NLO 204 and the conversion from fundamental to second harmonic is an equivalent loss to the laser cavity of the system 200. Thus, the fundamental power indeed drops as it partially converts into second harmonic wave (so-called pump depletion). Such depletion acts as a (nonlinear) cavity loss to the fundamental laser wavelength. The laser will reach a steady state, which also determines the available conversion efficiency. The fundamental intensity is higher inside the cavity than outside the cavity. Pump coatings are designed to ensure the fundamental light pass through NLO 204 (as well as the pump diode inside facet) without being reflected while letting the second harmonic be collected in a desired direction.

Basically, the intracavity embodiment takes advantage of the fact that the pump-power intensity is significantly higher inside the laser cavity compared to outside the laser cavity. Since conversion efficiency of the NLO 204 is proportional to power intensity of light within its acceptance band, the NLO 204 can produce higher power frequency-double light, despite pump depletion losses.

More particularly, the laser pump source 202 includes a laser diode 205, a collimating lens 206 and a diffraction grating 208, that acts as a wavelength selective mirror. An AR coating 212 is disposed on a front facet 209 of the laser diode 205 facing toward one end of the NLO 204. An HR coating 210 is disposed on a front facet of the laser diode 205 facing away from the NLO 204. An AR coating 215 is disposed on an opposite end of the NLO 204 facing toward the collimating lens 206 and away from the laser diode 205. A frequency-doubled light reflecting coating 217 is disposed on an end of the NLO 204 facing the laser diode 205. A power monitor 220 is provided to monitor the intensity of laser operation. A piezo-actuator 222 is provided to permit selective rotation of the diffraction grating 208 about a pivot point 224.

The coatings 210, 212, 215, 217 all serve to reduce reflections and their design will be readily understood by persons having ordinary skill in the art. In one embodiment, their characteristics are as follows.

|  | AR | HR |
| --- | --- | --- |
| coating 210 | — | F |
| coating 212 | F | — |
| coating 215 | F, S | — |
| coating 217 | F | S |

Where AR means anti-reflective; HR means half-reflective; F means fundamental wavelength; and S means second harmonic wavelength.

The laser pump source 202 of the first intracavity laser system 200 of FIG. 2 is configured to operate as an external cavity diode laser in a Littrow configuration, similar to the operation of the pump laser source 102 of the extracavity SHG laser system 100 of FIG. 1. The pump laser cavity extends from a front facet 210, which faces away from the NLO 204 and which serves as one reflective surface, to the diffraction grating 208, which serves as another reflective surface. Light at a fundamental frequency emitted by laser diode 205, through the AR Coating 212 on the front facet 209 facing the NLO 204, passes into the NLO 204.

The NLO 204 frequency-doubles the fundamental frequency light that enters from the laser diode 205. Frequency-doubled light emanates from an end of the NLO 204 adjacent to the collimating lens 206. The light emitted by the NLO 204 is collimating by the collimating lens 206 and passes to a diffraction grating 208. First-order diffraction, of the pump wavelength (not the doubled wavelength), from the grating 226 is diffracted back on itself as indicated by arrows 228. Zero-order diffraction of residual pump wavelength light indicated by arrows 230 is diffracted in a different direction. Specifically, zero-order diffraction (otherwise known as reflection) of frequency-doubled output will exit at basically the same angle (230) as zero-order beam of pump wavelength.

A Littrow angle is chosen so that the first-order diffraction involves light having a desired frequency that is to be doubled by the NLO 204. The diffracted first-order light passes through the collimating lens 206 and into the end of the NLO 204 facing the collimating lens 206. The NLO 204 frequency-doubles the first-order diffraction light that enters it, but the reflector 217 prevents the frequency-doubled light from passing through to the laser diode 205. The reflected frequency-doubled light passes back through the NLO 204, to the diffraction grating 208 which diffracts it in direction 230. The NLO 204 passes first-order diffracted light at the fundamental frequency through its end facing the laser diode 205. It will be appreciated that the NLO 205 does not frequency-double all light that passes through it, since it is not 100% efficient.

The diffraction grating 208 diffracts light of different frequencies in different directions. Thus, the frequency-doubled light emanating from the NLO 204 is diffracted in a direction different from the zero-order diffraction 230. The frequency-doubled light indicated by arrows 232, serves as the SHG optical output.

Figure 3:
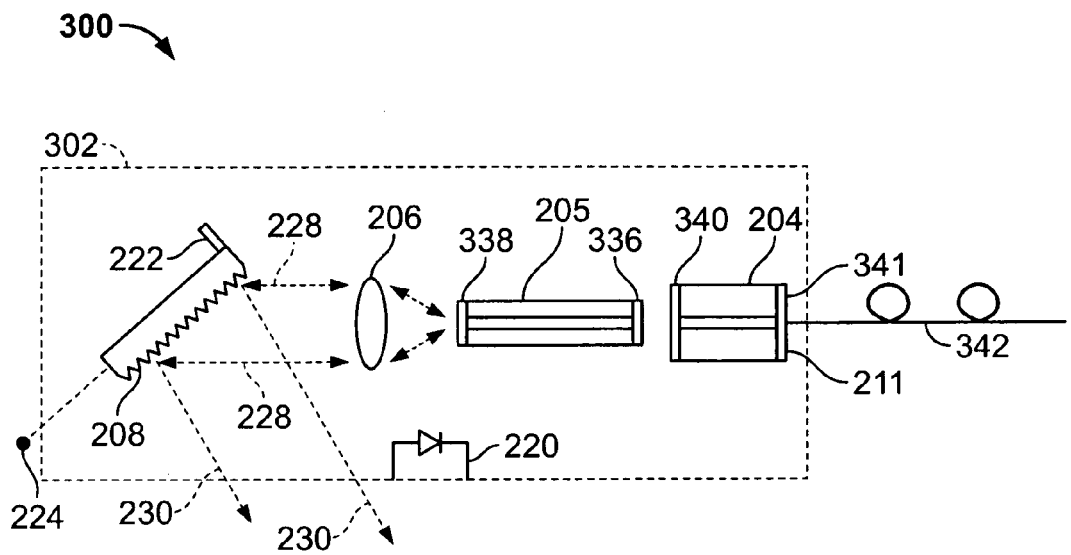
FIG. 3 is an illustrative drawing of a second intracavity SHG laser system in accordance with a second intracavity laser system embodiment of the invention.

FIG. 3 is an illustrative diagram of a second intracavity SHG laser system 300 in accordance with a second intracavity laser system embodiment of the invention. Components of the embodiments of FIGS. 2–3 are quite similar. Components of the first and second intracavity embodiment 200, 300 that are identical are identified by identical reference numerals. In the following description only portions of the second intracavity embodiment 300 that differ from that of the first intracavity embodiment 200 will be described.

In both the first and second intracavity embodiments 200 and 300, the respective NLO 204 is disposed within respective pump laser sources resonant cavities 202, 302. However, the positions of the NLO 204 and laser diode 205 are swapped in FIG. 3 relative to their positions in FIG. 2. In addition, in the second intracavity embodiment illustrated in FIG. 3, the coatings are selected such that the resonant cavity 302 extends between the front facet of NLO 204 facing away from the laser diode 205 and the grating 208.

Coating 336 is disposed on an end of laser diode 205 facing the NLO 204. A coating 338 is formed on an end of the laser diode 205 facing the collimating lens 206. Coating 340 is formed on a front facet of the NLO 204 facing the laser diode 205. A fiber output 342 is disposed adjacent a front facet of the NLO 204 that has a coating 341 and that faces away from the laser diode 205.

The laser diode 205 of second intracavity embodiment of FIG. 3, has a coating 336 disposed on its end adjacent the NLO 204 that allows fundamental light to pass from the laser diode 205 into the NLO 204 and to emanate from a front facet 211 of the NLO 204 adjacent the fiber output 342.

The types of coatings used in the second intracavity embodiment are indicated in the following chart.

|  | AR | HR |
| --- | --- | --- |
| coating 338 | F | — |
| coating 336 | F | — |
| coating 340 | F | S |
| coating 341 | S | F |

Figure 4:
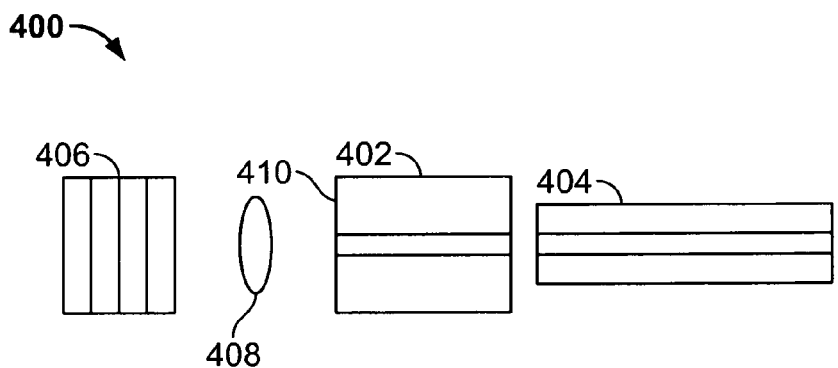
FIG. 4 is an illustrative drawing of an SHG laser system, which employs a Bragg grating in accordance with another embodiment of the invention.

FIG. 4 is an illustrative drawing of an SHG laser system 400 of another alternative embodiment of the invention. The SHG laser system 400 includes a laser diode 402, a Bragg grating 406, a collimating lens 408 and an NLO 404. A first front facet 410 of the laser diode 402 faces the collimating lens 408. A second front facet 412 of the laser diode 402 faces the NLO 404. A laser cavity extends from the second front facet to the Bragg grating 406. The Bragg grating 406 provides wavelength selective feedback such that the laser 402 lases at a single longitudinal mode and at a single frequency. The single mode, single frequency laser light emanating from laser diode 402 is frequency-doubled by the NLO 404. Intensity noise in the NLO 404 is reduced since the laser energy emanating from the laser diode 402 is single mode and single frequency. (The collimating lens 408 collimates light emanating from the first facet 610 of laser diode 402.)

Figure 5:
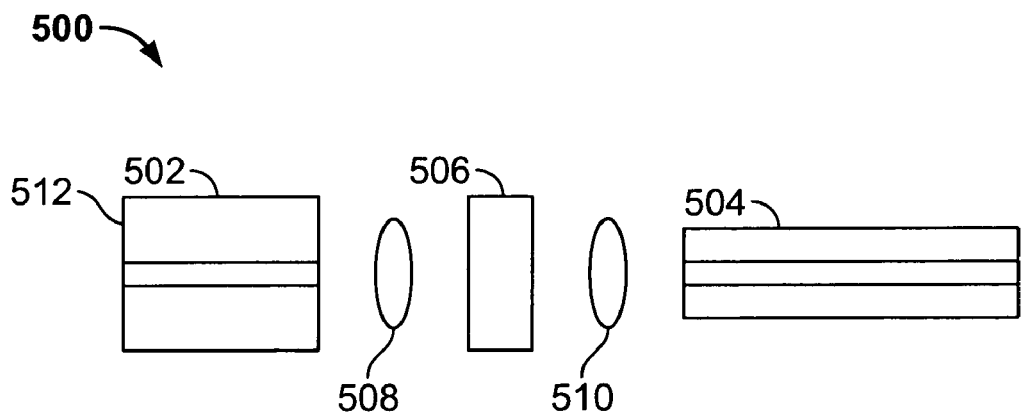
FIG. 5 is an illustrative drawing of an SHG laser system, which employs a holographic volume holographic grating in accordance with an embodiment of the invention.

FIG. 5 is an illustrative drawing of an SHG laser system 500 of another alternative embodiment of the invention. The SHG laser system 500 includes a laser diode 502 and an NLO 504, a holographic volume Bragg grating 506, a collimating lens 508 and a collimating lens 510. The resonant cavity is between the front facet 512 of laser diode 502, facing away from lens 508, and grating 506.

Figure 6:
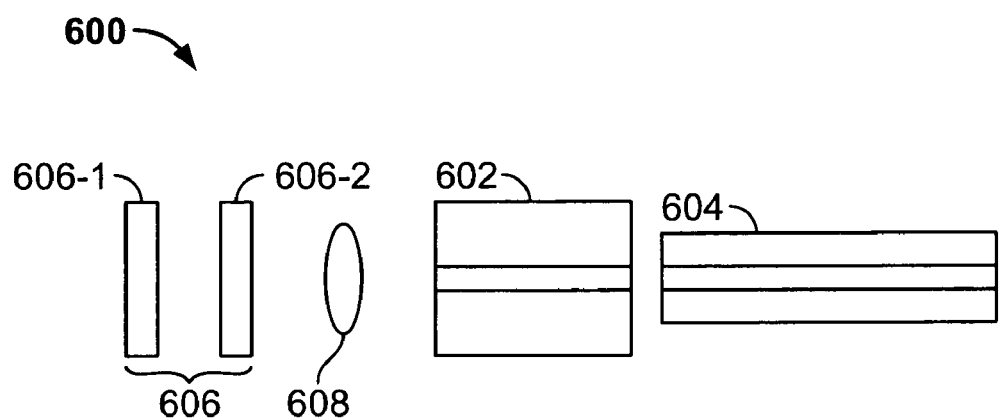
FIG. 6 is an illustrative drawing of an SHG laser system, which employs a pair of etalons in accordance with an embodiment of the invention.

FIG. 6 is an illustrative drawing of an SHG laser system 600 in accordance with another alternative embodiment of the invention. The SHG laser system 600 includes a laser diode 602, an NLO 604, and etalon 606 and a collimating lens 608. The etalon includes flats 606-1 and 606-2. The etalon 606 serves as a wavelength dependent filter, which restricts the wavelengths that can pass through it. The etalon 606 essentially serves as a Fabry-Perot cavity, which imposes a longitudinal mode on laser light emanating from the laser diode 602. In operation, laser light emanating from laser diode 602 is collimated by collimating lens 608. To the incident light, the etalon acts like a wavelength selective mirror, which as desired reflectivity at particular wavelength (by choosing appropriate reflectivities on 606-1 and 2 as well as the gap between these two flats) therefore maintain the laser cavity resonance for a single longitudinal mode of the laser cavity. Single mode, single frequency laser light provided by the laser diode 602 is frequency-doubled by the NLO 604. Since the laser light emanating diode 602 has a single frequency and a single mode, intensity noise in the NLO 604 is reduced.

It will be understood that the foregoing description and drawings of preferred embodiment in accordance with the present invention are merely illustrative of the principles of this invention, and that various modifications can be made by those skilled in the art without departing from the scope and spirit of the invention.

The invention claimed is:

1. A second harmonic generation laser system comprising:
a non-linear frequency converting medium; and
an external cavity pump laser that produces optical energy and that is disposed to provide the optical energy to the non-linear frequency converting medium, the external cavity pump laser including:
a laser diode; and
a diffraction grating;
wherein the laser diode and the diffraction grating are disposed in a Littrow configuration; and
wherein the laser diode is disposed between the non-linear frequency converting medium and the diffraction grating.

2. The system of claim 1,
wherein the non-linear frequency converting medium is disposed external to a cavity of the external cavity pump laser.

3. The system of claim 1,
wherein the non-linear frequency converting medium is disposed internal to a cavity of the external cavity pump laser.

4. The system of claim 1 further including:
a lens disposed between the laser diode and the diffraction grating.

5. The system of claim 1,
wherein the non-linear frequency converting medium is characterized by a frequency acceptance band; and further including:
means for tuning the external cavity pump laser to different single modes and to different single frequencies within the frequency acceptance band.

6. The system of claim 1,
wherein the non-linear frequency converting medium is disposed external a cavity of the external cavity pump laser; and wherein the non-linear frequency converting medium is characterized by a frequency acceptance band; and further including:
means for tuning the external cavity pump laser to different single modes and to different single frequencies within the frequency acceptance band.

7. The system of claim 1,
wherein the non-linear frequency converting medium is disposed internal to a cavity of the external cavity pump laser; and
wherein the non-linear frequency converting medium is characterized by a frequency acceptance band; and further including:
means for tuning the external cavity pump laser to different single modes and to different single frequencies within the frequency acceptance band.

8. The system of claim 1,
wherein the external cavity pump laser includes a gain medium and a Bragg reflector.

9. The system of claim 1,
wherein the external cavity pump laser includes a gain medium and a volume holographic volume grating.

10. The system of claim 1,
wherein the external cavity pump laser includes a gain medium and Fabry-Perot filter disposed to select a single constant mode and single frequency of the optical energy.

11. The system of claim 1,
wherein the external cavity pump laser includes a gain medium and first and second etalons disposed to select a single mode and at a single frequency of the optical energy.

12. A second harmonic generation laser system comprising:
a non-linear frequency converting medium;
an external cavity pump laser that produces optical energy and that is disposed to provide the optical energy to the non-linear frequency converting medium, the external cavity pump laser including:
a laser diode; and
a diffraction grating;
wherein the laser diode and the diffraction grating are disposed in a Littrow configuration;
wherein the laser diode is disposed between the non-linear frequency converting medium and the diffraction grating; and
wherein the laser diode and the non-linear frequency converting medium have coatings disposed thereon so as to cause a cavity of the external cavity pump laser to extend between the diffraction grating and a surface of the non-linear frequency converting medium that faces away from the laser diode and so as to cause frequency doubled light to emanate from the laser cavity as SHG laser output.

13. A second harmonic generation laser system comprising:
a non-linear frequency converting medium;
a laser diode;
a diffraction grating; and
a lens;
wherein the laser diode and the diffraction grating are disposed in a Littrow configuration;
wherein the laser diode is disposed between the non-linear frequency converting medium and the diffraction grating; and
wherein the lens is disposed between the laser diode and the diffraction grating.

14. The system of claim 13,
wherein the non-linear frequency converting medium is characterized by a frequency acceptance band; and further including:
means for adjusting the relative position of the diffraction grating so as to tune fundamental frequency energy of the laser system to different single modes and to different single frequencies within the frequency acceptance band.

* * * * *